United States Patent [19]

Takemae

[11] Patent Number: 4,597,063
[45] Date of Patent: Jun. 24, 1986

[54] SEMICONDUCTOR MEMORY ADDRESSING CIRCUIT

[75] Inventor: Yoshihiro Takemae, Tokyo, Japan
[73] Assignee: Fujitsu Limited, Kawasaki, Japan
[21] Appl. No.: 594,630
[22] Filed: Mar. 29, 1984

[30] Foreign Application Priority Data

Mar. 31, 1983 [JP] Japan .................................. 58-53586

[51] Int. Cl.⁴ ................................................ G11C 8/00
[52] U.S. Cl. ...................................... 365/230; 365/189
[58] Field of Search ............................... 365/230, 189

[56] References Cited

U.S. PATENT DOCUMENTS 4,045,783  8/1977  Harland .............................. 365/149
4,104,735  8/1978  Hofmann et al. ................... 365/230

Primary Examiner—James W. Moffitt
Attorney, Agent, or Firm—Armstrong, Nikadio, Marmelstein & Kubovcik

[57] ABSTRACT

A semiconductor memory device used, for example, for a graphic data storage device of a graphic display apparatus and so on, in which the data is read out not only from a target memory cell designated by an input address signal but also from one or more memory cells whose locations have predetermined relationships with the target memory cell. The semiconductor memory device comprises a plurality of memory cells, a plurality of data lines, a plurality of data buses, and a data line selecting circuit. The data line selecting circuit selectively connects a selected data line designated by an address signal to a particular data bus among the plurality of data buses and connects one or more data lines whose locations have predetermined relationships to that of the selected data line to other data buses which are different from the particular data bus. The signal of a designated data line is output to the particular data bus whichever data line is designated.

10 Claims, 4 Drawing Figures

SEMICONDUCTOR MEMORY ADDRESSING CIRCUIT

BACKGROUND OF THE INVENTION

1. Field of the Invention

The present invention relates to a semiconductor memory device, and more particularly, to a semiconductor memory device used, for example, for storing graphic data, in which not only the data of a memory cell designated by an address but also the data of memory cells in the periphery of the memory cell designated by the address can be read out at the same time.

2. Description of the Prior Art

In graphic data processing, i.e., picture processing, effected in a computer aided design system (CAD), a graphic display apparatus, a television signal transmission system, and so on, a graphic data memory is used for storing graphic data being processed. The graphic memory often stores graphic data in correspondence to the graph or picture displayed by a graphic display apparatus and so on. In graphic processing, it is necessary to effect data processing on the graphic data stored in such a graphic memory, i.e., data processing such as compressing, differentiating, smoothing, and so on. To effect such data processing, it is necessary to read out and process the data not only of the designated memory cell but also of the memory cells in the periphery thereof. Therefore, it is desired that, in such a graphic memory and the like, not only the designated memory cell but also the memory cells in the periphery thereof can be quickly accessed.

However, in a conventional semiconductor memory device, since the data is read out from only one memory cell designated by an input address at the same time, it is necessary to access the memory device many times when graphic data processing is effected. Therefore, the sequence of the graphic data processing becomes complex and the processing time becomes very long There is known another type of semiconductor memory device in which data is read out in parallel from a plurality of memory cells, for example, four memory cells, included in each cell group, for example, in each word, at the same time.

However, in such a memory device, the memory cells from which data can be read out in parallel are limited to those included within each cell group, and it is impossible to read out data simultaneously from memory cells belonging to different cell groups.

SUMMARY OF THE INVENTION

In order to solve the problems of the aforementioned conventional devices, the present invention uses the idea of making it possible to simultaneously access a memory cell connected to a word line and a data line and memory cells connected to the word line and one or more data lines which are disposed in locations having predetermined relationships with the location of the data line, by selecting the word line and the data line, in a semiconductor memory device used as a graphic data memory device and the like.

It is an object of the present invention to make it possible to simultaneously read out the data from a target memory cell and one or more memory cells disposed in the periphery thereof by the minimum access times, thereby reducing the time for graphic data processing and so on, and increasing the efficiency of the data processing.

According to the present invention, this object is attained by providing a semiconductor memory device characterized in that the semiconductor memory device comprises a plurality of memory cells, a plurality of data lines used for write-in of data to the memory cells and/or for readout of data from the memory cells, a plurality of data buses, and a data line selecting circuit for selectively connecting the data lines to the data buses in response to an address signal, the data line selecting circuit connecting a selected data line designated by the address signal to a particular data bus among the plurality of data buses and connecting one or more data lines whose locations or addresses have predetermined relationships to that of the selected data line to other data buses which are different from the particular data bus, the signal of a designated data line being output to the particular data bus whichever data line is designated.

DESCRIPTION OF THE PREFERRED EMBODIMENTS

Before describing the preferred embodiments, an explanation will be given of a computer system using conventional peripheral semiconductor devices in reference to FIGS. 1 and 2.

Figure 1:
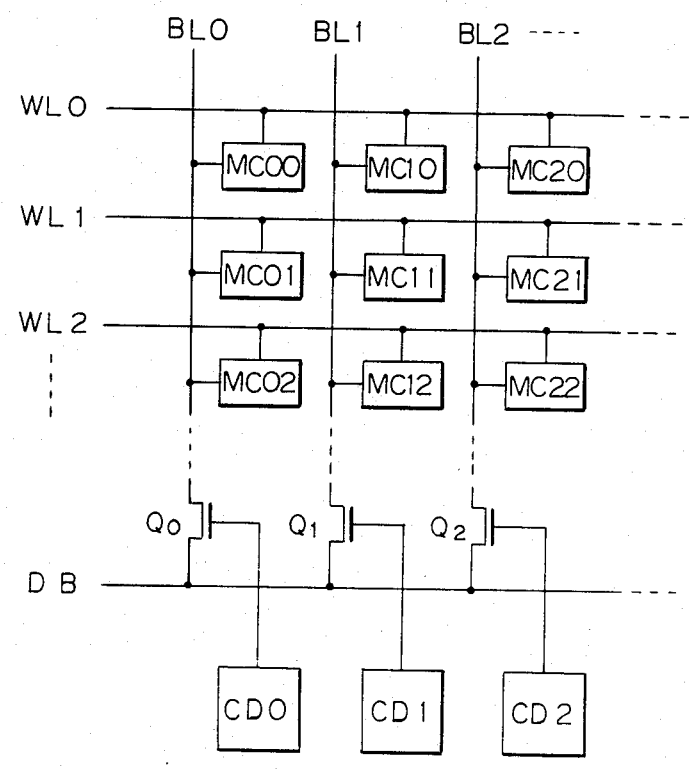
FIG. 1 and FIG. 2 are partial block circuit diagrams of a schematic structure of a conventional semiconductor memory device.

FIG. 1 illustrates an example of a conventional semiconductor memory device. The memory device shown in FIG. 1 is composed of word lines WL0, WL1, WL2, ---; data lines BL0, BL1, BL2, ---; memory cells MC00, MC01, MC02, ---, MC10, MC11, MC12, ---, and MC20, MC21, MC22, ---; a data bus DB; transistors $Q_0, Q_1, Q_2$, --- connected between the data lines BL0, BL1, BL2, --- and the data bus DB, respectively; and column decoders CD0, CD1, CD2, --- which supply a column selecting signal to the gates of the transistors $Q_0, Q_1, Q_2$, ---, respectively. In FIG. 1, each of the data lines BL0, BL1, BL2, --- and the data bus DB is shown by a single solid line, for simplicity. However, in practice, it should be noted that each of these data lines and the data bus is constituted of a pair of signal lines transmitting logic signals having opposite polarity.

In the memory device shown in FIG. 1, when data is read out, for example, from the memory cell MC11, a selecting signal having, for example, a high potential level, is applied to the word line WL1 from a row decoder (not shown in the drawing). Thereby, the memory cells MC01, MC11, MC21, --- connected to the word line WL1 are selected, and data read out from these memory cells is output to the corresponding data lines BL0, BL1, BL2, ---, respectively. At this time, the transistor $Q_1$ is turned on by the column decoder CD, and the data line BL1 and the data bus DB are connected. Therefore, the readout data from the memory cells MC11 is output through the data line BL1 and the data bus DB, so that a readout operation is performed.

It should be noted that, when the graphic data memorized in the aforementioned manner is compressed, differentiated, or smoothed, it is necessary to read out not only the data of the target memory cell but also the data of the memory cells in the periphery thereof. For example, when the data compression is effected, if the data memorized in the memory cells MC00, MC01, MC02, MC10, MC11, MC12, MC20, MC21, MC22 is compressed into the memory cell MC11, it is necessary to read out the data from these nine memory cells, to effect data compressing process of the data, and to again write-in the compressed data to the memory cell MC11.

However, in the conventional memory device shown in FIG. 1, since the data of only one memory cell designated by the address is read out at the same time, it is necessary to effect data readout nine times when such data compression is effected. Therefore, the sequence of the graphic data processing becomes complex and the processing time becomes very long.

Figure 2:
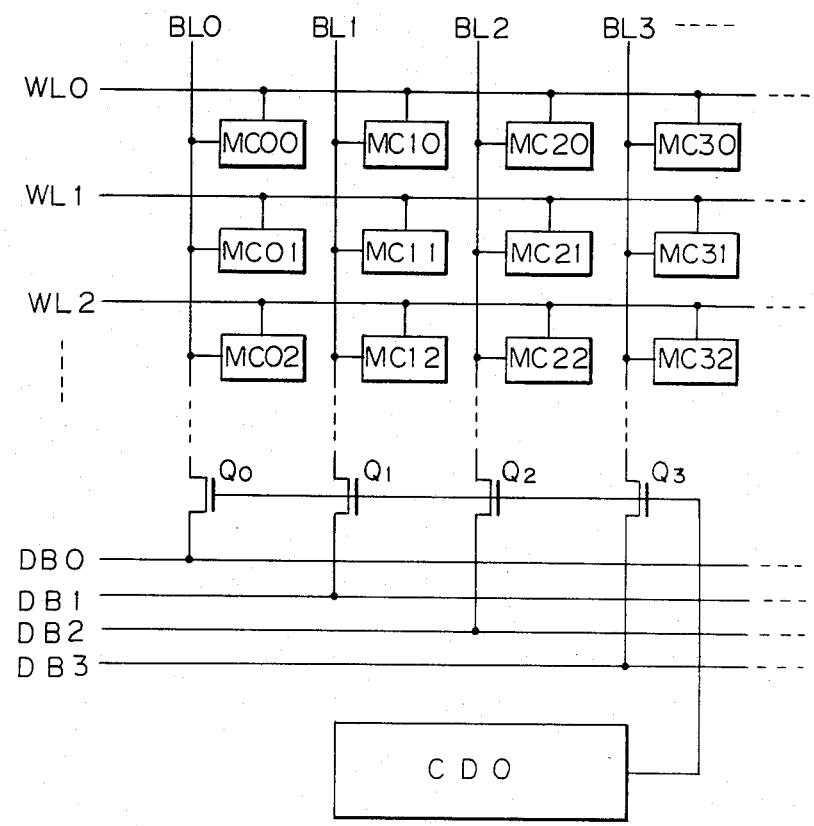

FIG. 2 illustrates another example of a conventional semiconductor memory device. The memory device shown in FIG. 2 is constituted of memory cells MC00, MC01, MC02, ---, MC10, MC11, --- connected between word lines WL0, WL1, WL2, --- and data lines BL0, BL1, BL2, BL3, ---; transistors $Q_0$, $Q_1$, $Q_2$, --- connected between the data lines BL0, BL1, BL2, BL3, --- and the data buses DB0, DB1, DB2, DB3; a column decoder CD0 which commonly controls the transistors $Q_0$ through $Q_3$ among these transistors and other column decoders.

In the memory device shown in FIG. 2, it is possible to read out the data from the four bits memory cells MC01, MC11, MC21, MC31 among the memory cells connected to a word line, e.g., WL1, to the data buses DB0, DB1, DB2, DB3 at the same time, by selecting the word line WL1 and applying a column selecting signal to the transistors $Q_0$, $Q_1$, $Q_2$, $Q_3$ from the column decode CD0. That is, in the memory device shown in FIG. 2, it is possible to effect a parallel readout operation in which four bits data is read out at the same time by designating one address.

However, in the memory device shown in FIG. 2, the memory cells from which data can be read out in parallel are limited to those connected to the data lines of a predetermined data line group. It is impossible to read out data simultaneously from the memory cells connected to the different sets of the data lines. Therefore, if the target memory cell is such a memory cell, for example MC31, that is connected to the data line disposed in each of the end portions of a data line group, it is impossible to read out the data from the memory cells on both sides of the target memory cell at the same time, and it is necessary to separately access the memory cell adjacently disposed on either side of the target memory cell.

According to the present invention, there is provided a semiconductor memory device which overcomes these problems.

Figure 3:
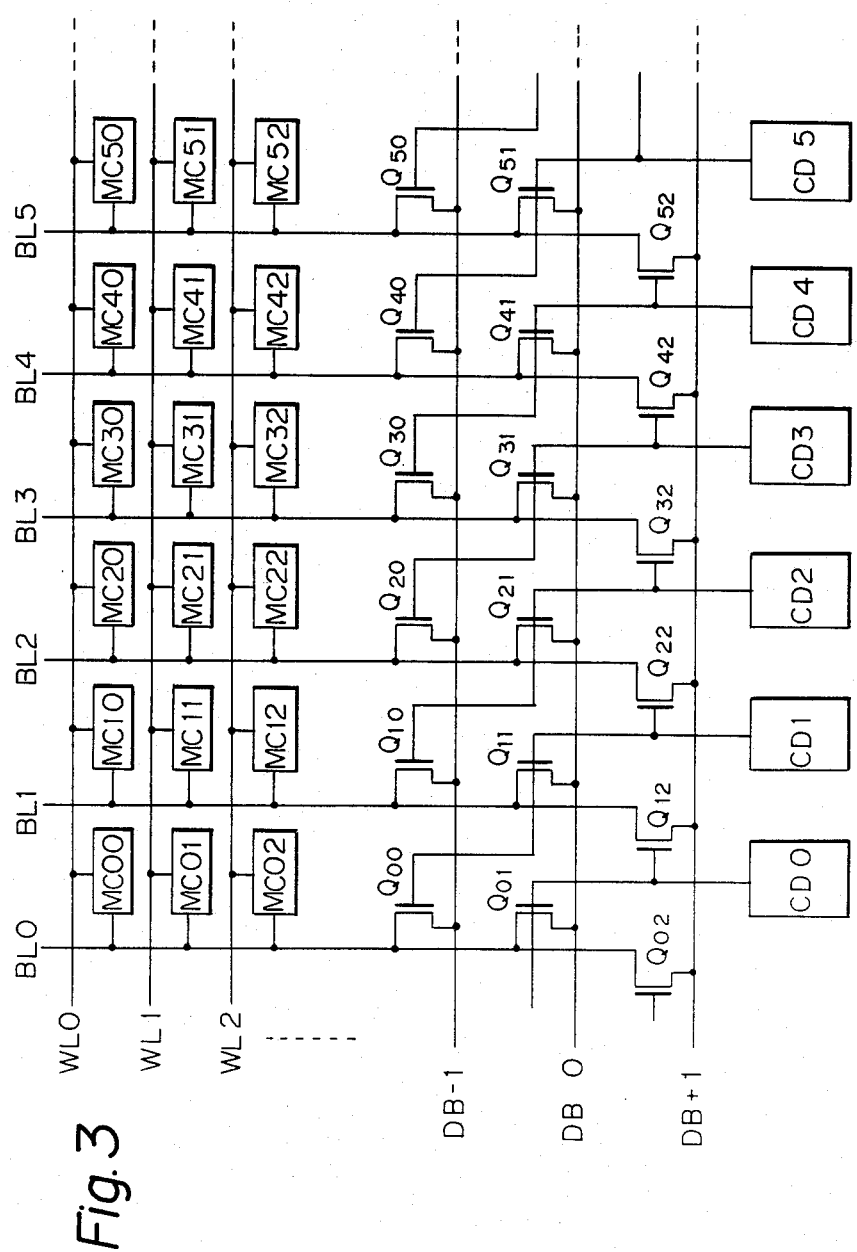
FIG. 3 is a partial block circuit diagram of a structure of a semiconductor memory device as an embodiment of the present invention.

Embodiments of the present invention will be explained with reference to the attached drawings. FIG. 3 partially illustrates a structure of a semiconductor memory device which is an embodiment of the present invention. The memory device shown in FIG. 3 comprises word lines WL0, WL1, WL2, ---; data lines BL0, BL1, BL2, ---; memory cells MC00, MC01, MC02, ---, MC10, MC11 MC12, ---; three data buses DB−1, DB0, DB+1; column decoders CD0, CD1, CD2, ---; transistors used for transfer gates $Q_{00}$, $Q_{01}$, $Q_{02}$, $Q_{10}$, $Q_{11}$, $Q_{12}$, ---; and so on. The transistors $Q_{00}$, $Q_{01}$, $Q_{02}$, are connected between the data line BL0 and the data buses DB−1, DB0, DB+1, respectively, the transistors $Q_{10}$, $Q_{11}$, $Q_{12}$ are connected between the data line BL1 and the data buses DB−1, DB0, DB+1, respectively, and each of the other transistors is connected between the corresponding data line and the corresponding data bus in a similar manner. The output of each column decoder is connected to the gate of the transistor connected between a data line and the data bus DB0, and to each of the gates of the transistors connected between the data lines disposed on both sides of the data line and the data buses DB−1 and DB+1, respectively. For example, the output of the column decoder CD1 is commonly connected to the gate of the transistor $Q_{11}$ connected between the data BL1 and the data bus DB0, to the gate of the transistor $Q_{00}$ connected between the data line BL0 and the data bus DB−1, and to the gate of the transistor $Q_{22}$ connected between the data line BL2 and the data bus DB+1. In FIG. 3, the data line means the line connecting the memory cells and the transfer gates disposed in one column. For example, the data line BL0 connects the memory cells MC00, MC01, MC02,---and the transistors $Q_{00}$, $Q_{01}$, $Q_{02}$.

In the memory device shown in FIG. 3, when a word line, for example, WL1, is selected and the potential thereof is rendered to high, the data of the memory cells MC01, MC11, MC21, MC31, --- connected to the word line WL1 is transmitted to the corresponding data lines BL0, BL1, BL2, BL3, ---, respectively. In this case, if, for example, the memory cell MC11 is the target memory cell, a column selecting signal is output from the column decoder CD1 and, thereby, the transistors $Q_{00}$ and $Q_{22}$ as well as the transistor $Q_{11}$ are turned on. Therefore, the data read out from the memory cell MC11 is output through the data line BL1, the transistor $Q_{11}$, and the data bus DB0 and, moreover, the data read out from the memory cells MC01 and MC21 disposed adjacently on both sides of the memory cell MC11 is output through the data lines BL0 and BL2, the transistors $Q_{00}$ and $Q_{22}$, and the data buses DB−1 and DB+1, respectively. Thus, it becomes possible to access the memory cell MC01 and MC21 adjacently disposed on both sides of the target memory cell MC11 simultaneously with the memory cells MC11 by addressing and accessing the target memory cell MC11, and thereby, to very effectively perform the graphic data processing in which not only the data of the target memory cell but also the data of the memory cells in the periphery thereof is necessitated. When, for example, the target memory cell is MC11 and when it is necessary to read out the data from nine memory cells in the periphery of and including the memory cell MC11, i.e., MC00, MC01, MC02, MC10, MC11, MC12, MC20, MC21, and MC22, in order to perform graphic data processing, it is possible to read out the data by a three times access operation in which the word lines WL0, WL1 and WL2 are sequentially selected together with the selection of the column decoder CD1.

In the above-mentioned embodiment, data is read out from the target memory cell and the memory cells adjacently disposed on both sides thereof at the same time. However, the memory cells from which data is read out simultaneously with the target memory cell are not limited to the memory cells adjacent the target memory cell but apparently can be the memory cells whose locations have a predetermined relationship to the target memory cell, or can be the memory cells whose addresses have a predetermined relationship thereto.

In the above-mentioned embodiment, it is possible to access three memory cells at the same time. However, the number of the memory cells which are accessed simultaneously can be further increased or decreased.

It should be noted that data write-in can be effected by supplying data only to the data bus, for example, DB0, in the data write-in time, in a manner similar to the conventional device. It is also possible to write-in the data in parallel to the target memory cell and the peripheral memory cells simultaneously by supplying data to the data buses DB0, DB−1, and DB+1.

Figure 4:
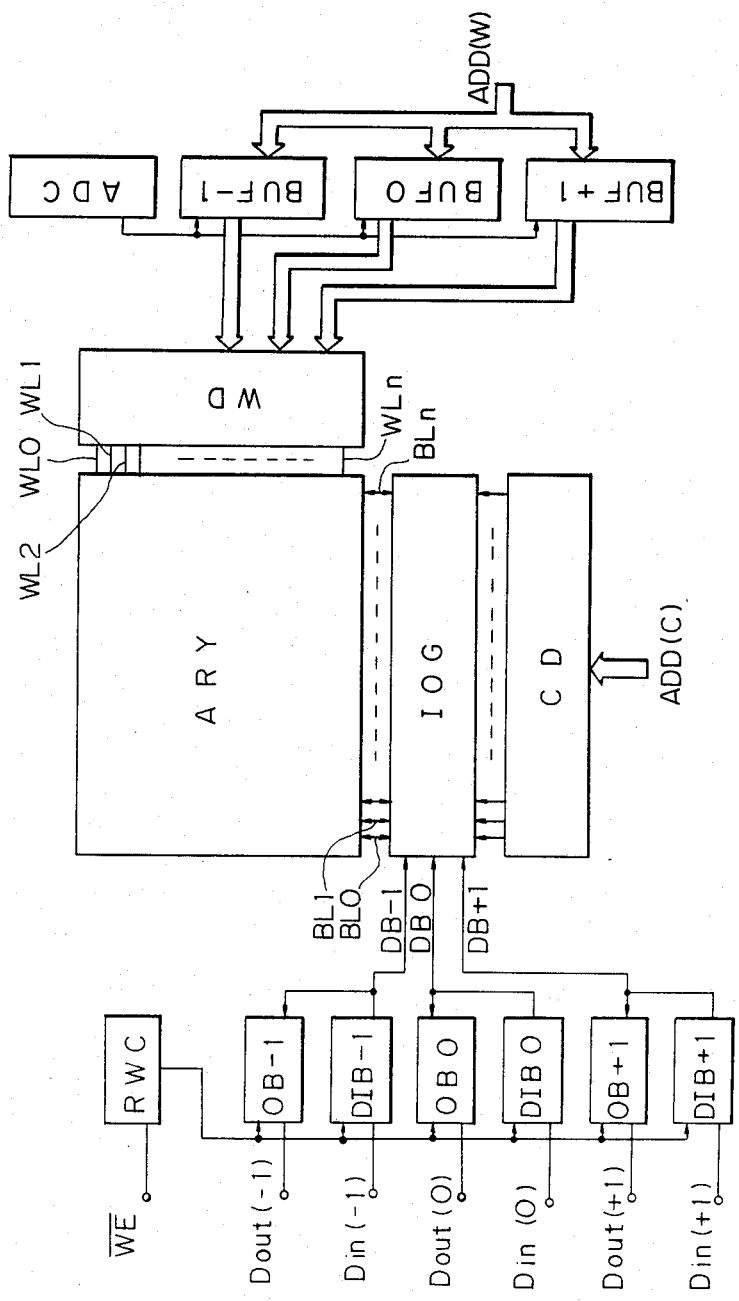
FIG. 4 is a block circuit diagram of a schematic structure of a semiconductor memory device as another embodiment of the present invention.

FIG. 4 illustrates a semiconductor memory device as another embodiment of the present invention. The semiconductor memory device shown in FIG. 4 comprises a memory cell array ARY having a plurality of memory cells arranged in a matrix, an input/output gate IOG connected to the memory cell array ARY through data lines BL0, BL1, ---, BLn, a column decoder CD, and a word decoder WD connected to the memory cell array ARY through word lines WL0, WL1, ---, WLn. The input/output gate comprises transfer gate circuits such as the transfer gate transistors of the memory device shown in FIG. 3 connected between the data lines BL0, BL1, ---, BLn and the data buses DB−1, DB0 and DB+1.

The semiconductor memory device shown in FIG. 4 further comprises output buffers OB−1, OB0, and OB+1 connected to the input/output gate IOG via data buses DB−1, DB0, and DB+1, respectively; data input buffers DIB−1, DIB0, and DIB+1 which are also connected to the input/output gate IOG via data buses DB−1, DB0, and DB+1, respectively; a read/write control circuit RWC controlling these buffers; address buffers BUF−1, BUF, and BUF+1 connected to the word decoder CD; and an address control circuit ADC controlling these address buffers. Among these address buffers, the address buffers BUF−1 and BUF+1 comprise, for example, a decrement circuit for generating a decremented address signal from an input word address signal ADD(W) and an increment circuit for generating an incremented address signal from the input word address signal ADD(W).

In the semiconductor memory device shown in FIG. 4, when, for example, readout operation is effected, a word address signal ADD(W) is applied to the address buffers BUF−1, BUF0, and BUF+1 and a column address signal ADD(C) is applied to the column decoder CD. At first, the address control circuit ADC applies a control signal to the address buffer BUF0, and the address buffer BUF0 supplies the buffered word address signal corresponding to the input word decoder WD. Thereby, the word decoder selects a word line, for example, a word line WL2, and renders the potential thereof high, so that the data of the memory cells connected to the selected word line WL2 is read out and transmitted to the input/output gate IOG via the data lines BL0, BL1, ---, BLn. The input/output gate IOG transfers the data on the three data lines designated by the column address signal ADD(C) to the data buses DB−1, DB0, and DB+1 under the control of the column decoder CD. The data on the data buses DB−1, DB0, and DB+1 is output via the output buffers OB−1, OB0, and OB+1, respectively, which are activated by the read/write control circuit RWC in accordance with the write-enable signal WE having, for example, a high potential level.

After the data is read out from the memory cells connected to the word line, e.g., WL2, designated by the buffered word address signal output from the address buffer BUF0, the address control circuit ADC supplies the control signal to the address buffer BUF−1. The address buffer BUF−1 generates a decremented address signal designating, for example, a word line WL1, from the input word address ADD(W) and supplies the decremented address signal to the word decoder WD. Therefore, the word line, for example, WL1, is selected and the data is read out from three memory cells which are connected to the word line WL1 and which are selected by the column address signal ADD(C), in the same manner as previously mentioned.

The address control circuit ADC then supplies the control signal to the address buffer BUF+1. The address buffer BUF+1 generates an incremented address signal designating, for example, a word line WL3, from the input word address ADD(W) and supplies the incremented address signal to the word decoder WD. Therefore, the data is read out from three memory cells connected to the word line WL3 and selected by the column address signal ADD(C) in the same manner as previously mentioned.

As is apparent from the above description, in the semiconductor memory device shown in FIG. 4, it is possible to read out the data not only from the target memory cell but also the memory cells in the periphery thereof at the same time by designating only the target memory cell by the word address ADD(W) and the column address ADD(C). It should be noted that in the memory device of FIG. 4, the write-in operation is performed similarly by supplying input data Din(−1), Din(0), and Din (+1) to the data input buffers DIB−1, DIB0, and DIB+1 and by supplying the word address ADD(W) and the column address ADD(C). In this case, the write enable signal $\overline{WE}$ is rendered, for example, low, so that the read/write control circuit RWC enables the data input buffers DIB−L, DIB0, and DIB+1.

In a brief summary, according to the present invention, it is possible to simultaneously access not only a target memory cell but also memory cells whose locations have a predetermined relationship to the target memory cell, such as the memory cells adjacently disposed on both sides of the target memory cell and so on. Therefore, it becomes possible to quickly access memory cells in the periphery of a target memory cell and, thereby, to increase the speed and efficiency of the processing in the graphic data processing and the like.

I claim:

1. A semiconductor memory device characterized in that said semiconductor memory device comprises a plurality of memory cells, a plurality of data lines used for write-in of data to said memory cells and/or for readout of data from said memory cells, a plurality of data buses, and a data line selecting circuit for selectively connecting said data lines to said data buses in response to an address signal, said data line selecting circuit connecting a selected data line designated by said address signal to a particular data bus among said plurality of data buses and connecting one or more data lines whose locations have predetermined relationships to that of said selected data line to other data buses which are different from said particular data bus, the signal of a designated data line being output to said particular data bus whichever data line is designated.

2. A semiconductor memory device according to claim 1, wherein said data lines whose locations have predetermined relationships to that of said selected data line are data lines including at least one data line whose address is before that of said selected data line and including at least one data line whose address is behind that of said selected data line.

3. A semiconductor memory device according to claim 2, wherein said data lines whose locations have predetermined relationships to that of said selected data line are two data lines, one of said data lines having the address just before that of said selected data line and the other having the address just behind that of said selected data line.

4. A semiconductor memory device according to claim 1, wherein said data lines whose locations have predetermined relationships to that of said selected data line are data lines including at least two data lines whose addresses are both before or behind that of said selected data line.

5. A semiconductor memory device according to claim 1, wherein said data lines whose locations have predetermined relationships to that of said selected data lines are data lines adjacently disposed on both sides of said selected data line.

6. A semiconductor memory device according to claim 1, wherein said data line selecting circuit comprises a plurality of transfer gate transistors each being connected between one of said data lines and one of said data buses and each being turned on or off in accordance with said address signal.

7. A semiconductor memory device according to claim 6, wherein said data line selecting circuit further comprises a column decoder which decodes said address signal and supplies gate signals to said transfer gate transistors.

8. A semiconductor memory device according to claim 1, wherein said semiconductor memory device comprises a data output buffer and/or a data input buffer for every data bus.

9. A semiconductor memory device according to claim 8, wherein said semiconductor memory device further comprises a read/write control circuit which enables said data output buffer or said data input buffer in accordance with a write-enable signal.

10. A semiconductor memory device according to claim 1, wherein said memory cells are connected between word lines and said data lines and said semiconductor memory device further comprises a word address decoder and a circuit for incrementing and/or decrementing an input word address.

* * * * *